US012805253B2

(12) United States Patent
Lee et al.

(10) Patent No.: US 12,805,253 B2
(45) Date of Patent: Nov. 17, 2026

(54) SUBSTRATE TRANSFER APPARATUS ALLOWING MOVEMENT BETWEEN LAYERS

(71) Applicant: VM Inc., Icheon-si (KR)

(72) Inventors: Sang Woo Lee, Suwon-si (KR); Woo Hyung Choi, Seongnam-si (KR)

(73) Assignee: VM Inc., Icheon-si (KR)

( * ) Notice: Subject to any disclaimer, the term of this patent is extended or adjusted under 35 U.S.C. 154(b) by 424 days.

(21) Appl. No.: 18/532,966

(22) Filed: Dec. 7, 2023

(65) Prior Publication Data

US 2025/0029859 A1 Jan. 23, 2025

(30) Foreign Application Priority Data

Jul. 21, 2023 (KR) ........................ 10-2023-0095256

(51) Int. Cl.
*H10P 72/30* (2026.01)

(52) U.S. Cl.
CPC ...... *H10P 72/3214* (2026.01); *H10P 72/3204* (2026.01); *H10P 72/3208* (2026.01)

(58) Field of Classification Search
CPC ............. H10P 72/3214; H10P 72/3204; H10P 72/3208; H02P 25/06; B65G 1/065; B65G 1/0492; B65G 54/02
See application file for complete search history.

(56) References Cited

U.S. PATENT DOCUMENTS

| | | | |
|---|---|---|---|
| 12,227,110 B2 * | 2/2025 | Tokumoto | B60L 7/22 |
| 2016/0013087 A1 * | 1/2016 | Yoshioka | B65G 1/06<br>414/659 |
| 2017/0050332 A1 | 2/2017 | Bauer et al. | |

FOREIGN PATENT DOCUMENTS

| | | | | |
|---|---|---|---|---|
| CN | 102897538 A | | 1/2013 | |
| CN | 113707585 A | | 11/2021 | |
| JP | H05254660 A | * | 10/1993 | |
| JP | 2000-68350 A | | 3/2000 | |
| JP | 2009-107478 A | | 5/2009 | |
| JP | 2012-516103 A | | 7/2012 | |
| JP | 2022-508019 A | | 1/2022 | |
| JP | 2022-54343 A | | 4/2022 | |
| JP | 2022-82512 A | | 6/2022 | |
| JP | 2022-113548 A | | 8/2022 | |
| KR | 10-1757865 B1 | | 7/2017 | |
| KR | 10-2019-0015130 A | | 2/2019 | |
| KR | 10-2207874 B1 | | 1/2021 | |
| KR | 20210004923 A | * | 1/2021 | E01B 25/305 |
| KR | 10-2021-0013879 A | | 2/2021 | |
| KR | 10-2231176 B1 | | 3/2021 | |
| KR | 10-2428369 B1 | | 8/2022 | |
| KR | 10-2023-0015816 A | | 1/2023 | |
| KR | 10-2528797 B1 | | 5/2023 | |
| TW | 200818247 A | | 4/2008 | |

(Continued)

*Primary Examiner* — Ernesto A Suarez
*Assistant Examiner* — Adarsh Neupane
(74) *Attorney, Agent, or Firm* — Park, Kim & Suh, LLC

(57) ABSTRACT

Disclosed is a substrate transfer apparatus including a first moving plate, a second moving plate located on a lower side of the first moving plate, a shuttle that is moved on the first moving plate or the second moving plate and that accommodates a substrate, and a first layer transfer connected to the first moving plate and the second moving plate, and that moves the shuttle from any one of the first moving plate and the second moving plate to the other one.

16 Claims, 6 Drawing Sheets

(56) References Cited

FOREIGN PATENT DOCUMENTS

| | | | |
|---|---|---|---|
| TW | 201349376 | A | 12/2013 |
| TW | 201716312 | A | 5/2017 |
| WO | 94/26640 | A1 | 11/1994 |
| WO | 2019/114155 | A1 | 6/2019 |
| WO | 2023/121440 | A1 | 6/2023 |

* cited by examiner

SUBSTRATE TRANSFER APPARATUS ALLOWING MOVEMENT BETWEEN LAYERS

CROSS-REFERENCE TO RELATED APPLICATIONS

This application claims priority under 35 U.S.C. § 119 to Korean Patent Application No. 10-2023-0095256 filed on 21 Jul. 2023, in the Korean Intellectual Property Office, the disclosures of which are incorporated by reference herein in their entireties.

BACKGROUND

Embodiments of the present disclosure described herein relate to a substrate transfer apparatus, and more particularly, relate to a substrate transfer apparatus that allows movement of a substrate between layers.

A decrease in an area of equipment used for semiconductor or display processes is very important. For example, as an area occupied by the substrate transfer apparatus decreases, a larger number of equipment may be disposed in a factory whereby productivity and production capacity are enhanced. Furthermore, because of the use of spaces in the factory due to the decrease in the area is optimized, an efficiency of the use of the spaces may be enhanced whereby costs may be advantageously reduced, and because movement time may be reduced in a production process by shortening the movement path whereby a production line may be optimized. Accordingly, a technology for increasing a processing amount per unit area of the equipment used for a semiconductor process is necessary.

SUMMARY

An aspect of the present disclosure provides a substrate transfer apparatus that allows movement of a substrate between layers for enhancing a processing amount in a limited area.

According to an embodiment of the present disclosure, a substrate transfer apparatus includes a first moving plate, a second moving plate located on a lower side of the first moving plate, a shuttle configured to be moved on the first moving plate or the second moving plate and configured to accommodate a substrate, and a first layer transfer connected to the first moving plate and the second moving plate, and configured to move the shuttle from any one of the first moving plate and the second moving plate to the other one.

Here, one end of the first layer transfer is connected to the first moving plate, and an opposite end thereof is connected to the second moving plate.

Here, the first layer transfer has a spiral shape including a curved surface.

Here, the first moving plate includes a first side surface and a second side surface, wherein the second moving plate includes a third side surface corresponding to the first side surface and a fourth side surface corresponding to the second side surface, wherein the one end of the first layer transfer is connected to the first moving plate to be closer to the first side surface rather than to the second side surface, and wherein the opposite end of the first layer transfer is connected to the second moving plate to be closer to the fourth side surface rather than to the third side surface.

Here, each of the first moving plate and the second moving plate includes a magnetic levitation rail, and wherein the shuttle is magnetically levitated by the magnetic levitation rails to be moved on the first moving plate or the second moving plate.

Here, the substrate transfer apparatus may further include a third moving plate disposed to be adjacent to the first moving plate, and a first link connected to the first moving plate and the third moving plate, and configured to move the shuttle from any one of the first moving plate and the third moving plate to the other one.

Here, the substrate transfer apparatus may further include a second layer transfer connected to the second moving plate and the third moving plate, and configured to move the shuttle from any one of the second moving plate and the third moving plate to the other one.

Here, wherein the second moving plate includes a third side surface and a fourth side surface, wherein the first layer transfer is connected to the first moving plate to be closer to the fourth side surface than to the third side surface, and wherein the second layer transfer is connected to the first moving plate to be closer to the third side surface than to the fourth side surface.

Here, the substrate transfer apparatus may further include a fourth moving plate disposed to be adjacent to the second moving plate, and a second link connected to the second moving plate and the fourth moving plate, and configured to move the shuttle from any one of the second moving plate and the fourth moving plate to the other one.

Here, the substrate transfer apparatus may further include a third layer transfer connected to the first moving plate and the fourth moving plate, and configured to move the shuttle from any one of the first moving plate and the fourth moving plate to the other one.

Here, the first moving plate includes a first side surface and a second side surface, wherein the first layer transfer is connected to the first moving plate to be closer to the first side surface than to the second side surface, and wherein the third layer transfer is connected to the first moving plate to be closer to the second side surface than to the first side surface.

Here, the first layer transfer includes a protector configured to prevent a collision or a fall of the shuttle.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
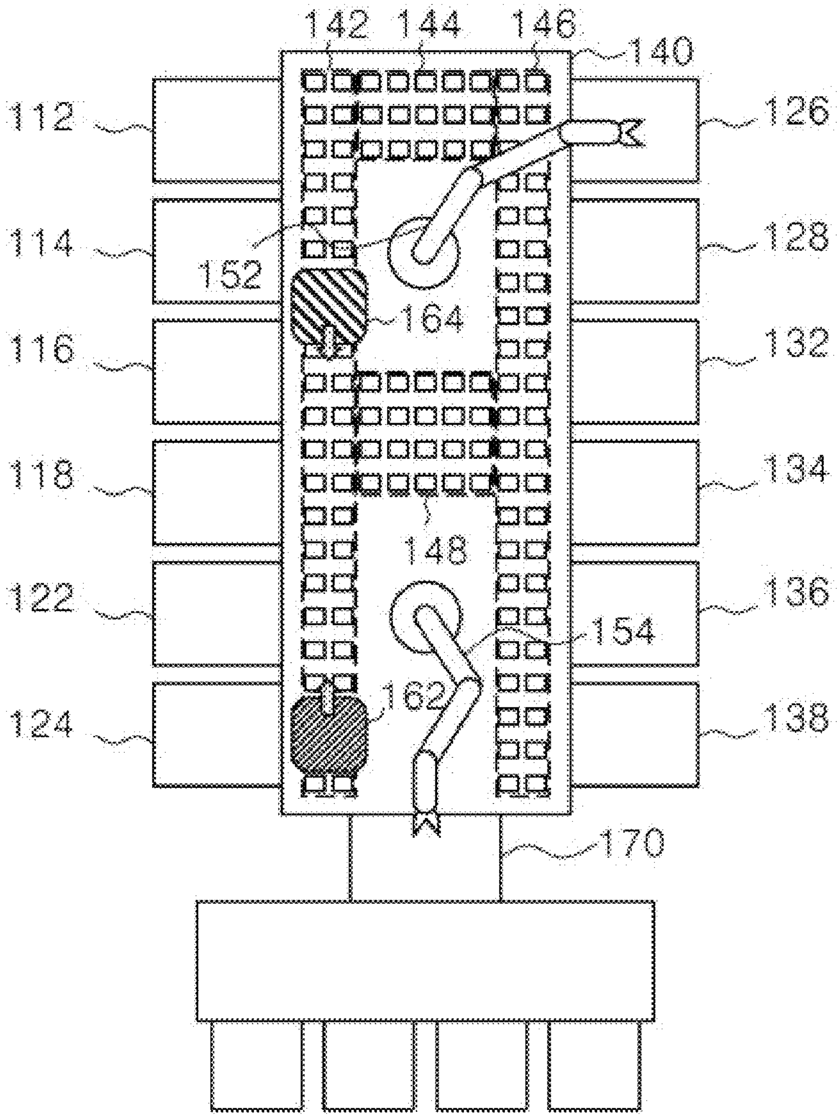
FIG. 1 is a view illustrating a substrate transfer process using a substrate transfer apparatus according to an embodiment.

The embodiments disclosed in the specification is for clearly explaining the spirits of the present disclosure to an ordinary person in the art, to which the present disclosure pertains, and thus, the present disclosure is not limited to the embodiments disclosed in the specification, and the scope of the present disclosure should be construed as including corrections or modifications that do not depart from the spirits of the present disclosure.

General terms used as currently widely as possible are selected as the terms used in the specification in consideration of the functions in the present disclosure, but the terms used in the specification may be changed according to an intention of an ordinary person in the art, to which the present disclosure pertains, a precedent, or advent of a new technology. However, unlike this, when a specific term is defined as an arbitrary meaning to be used, the meaning of the term will be described separately. Accordingly, the terms used in the specification should be construed based on not the simple names of the terms or substantial meanings of the terms, and the contents over the specification.

The drawings attached to the specification are for easily explaining the present disclosure, and the shapes illustrated in the drawings are exaggerated according to necessities to help understanding of the present disclosure, and thus the present disclosure is not limited by the drawings.

In the specification, when it is determined that a detailed description of known configurations or functions related to the present disclosure may make the essence of the present disclosure unclear, a detailed description thereof will be omitted according to necessities.

FIG. 1 is a view illustrating a substrate transfer process using a substrate transfer apparatus according to an embodiment.

Referring to FIG. 1, a substrate transfer apparatus according to an embodiment may include at least one of a plurality of processing chambers 112 to 138, a moving plate 140, magnetic levitation rails 142 to 148, a plurality of arms 152 and 154, and a plurality of shuttles 162 and 164.

The first shuttle 162 and/or the second shuttle 164 may be moved along the magnetic levitation rails 142 to 148 to transfer a substrate (hereinafter, the first shuttle 162 will be mainly described). In detail, the first shuttle 162 may fetch a substrate from any one of the plurality of processing chambers 112 to 138, and may transfer the fetched substrate to the magnetic levitation rails 142 to 146. Thereafter, the substrate may be delivered to a load lock chamber 170 by at least one of the plurality of arms 152 and 154.

The magnetic levitation rails 142 to 148 may include a plurality of areas. In detail, the magnetic levitation rails 142 to 148 may include the first rail area 142 that is disposed at one periphery of one surface of the moving plate 140 along a longitudinal direction, and the second rail area 146 that is disposed at an opposite periphery of the one surface of the moving plate 140 along the longitudinal direction.

The magnetic levitation rails 142 to 148 may include the third rail area 144 and/or the fourth rail area 148 that is configured to connect the first rail area 142 and the second rail area 146. In this case, the third rail area 144 and/or the fourth rail area 148, as illustrated in FIG. 1, may be disposed along a transverse direction of the moving plate 140.

Meanwhile, the magnetic levitation rails 142 to 148 may include an area for stopping any one shuttle such that the plurality of shuttles 162 and 164 are prevented from colliding with each other while the plurality of shuttles 162 and 164 are moved. In this way, the area for the stop may be included in a specific partial area of the magnetic levitation rails 142 to 148. Alternatively, the area for the stop may be selected as a partial area of the magnetic levitation rails 142 to 148 based on movement directions and/or locations of the plurality of shuttles 162 and 164.

Additionally or alternatively, the magnetic levitation rails 142 to 148 may include the third rail area 144 and/or the fourth rail area 148 for moving one of the plurality of shuttles 162 and 164 from one periphery (that is, the first rail area 142) of the moving plate 140 to an opposite periphery (that is, the second rail area 146) of the moving plate 140.

The plurality of shuttles 162 and 164 may include the first shuttle 162 and/or the second shuttle 164. FIG. 1 illustrates that the plurality of shuttles 162 and 164 include two shuttles, but the present disclosure is not limited thereto. For example, the plurality of shuttles 162 and 164 may include three or more shuttles.

Each of the plurality of shuttles 162 and 164 may accommodate one or more substrates. For example, an arbitrary one of the plurality of shuttles 162 and 164 may carry a target substrate that is to be processed in any one of the plurality of processing chambers 112 to 138, and may transfer the substrate to any one processing chamber. As another example, an arbitrary shuttle may transfer a substrate processed in any one processing chamber to the load lock chamber 170 while containing it.

The second shuttle 164 may be stopped in another predetermined area of the magnetic levitation rails 142 to 148 such that a path including one area of the magnetic levitation rails 142 to 148 is provided to the first shuttle 162. In this case, among the plurality of shuttles 162 and 164, a shuttle that is stopped in the another area may be determined as a shuttle that is located relatively close to the another area.

In detail, the first shuttle 162 is being moved upwards along the first rail area 142, and the second shuttle 164 is being moved downwards along the first rail area 142. In this case, the second shuttle 164 located relatively close to the fourth rail area 148 that is set to the another area may be moved to the fourth rail area 148 and may be stopped.

Accordingly, the first shuttle 162 may continue to be moved along the first rail area 142. However, the area, in which the second shuttle 164 is stopped, is not limited to the fourth rail area 148. For example, when the path including the another area has to be provided to the first shuttle 162, the second shuttle 164 may be stopped in the another area.

Meanwhile, although FIG. 1 illustrates an example of the plurality of shuttles 162 and 164 being moving along the same rail area, the present disclosure is not limited thereto. For example, the first shuttle 162 may be being moved from the first rail area 142 to the second rail area 146 via the third rail area 144, and the second shuttle 164 may be being moved from the second rail area 146 to the first rail area 142 via the third rail area 144.

In this case, the first shuttle 162 that is located relatively close to the fourth rail area 148 may be moved to the second rail area 146 via the fourth rail area 148. Accordingly, the second shuttle 164 may be moved to the first rail area 142 via the third rail area 144. That is, movement directions and/or stop locations of the plurality of shuttles 162 and 164 may be controlled not to collide with each other.

In this case, the movement directions and/or the stop locations of the plurality of shuttles 162 and 164 may be determined such that a total movement direction of the plurality of shuttles 162 and 164 is minimal. Due to the configuration, the substrate transfer apparatus may enhance throughput and reduce energy consumption by providing efficient flows to the plurality of shuttles 162 and 164.

Figure 2:
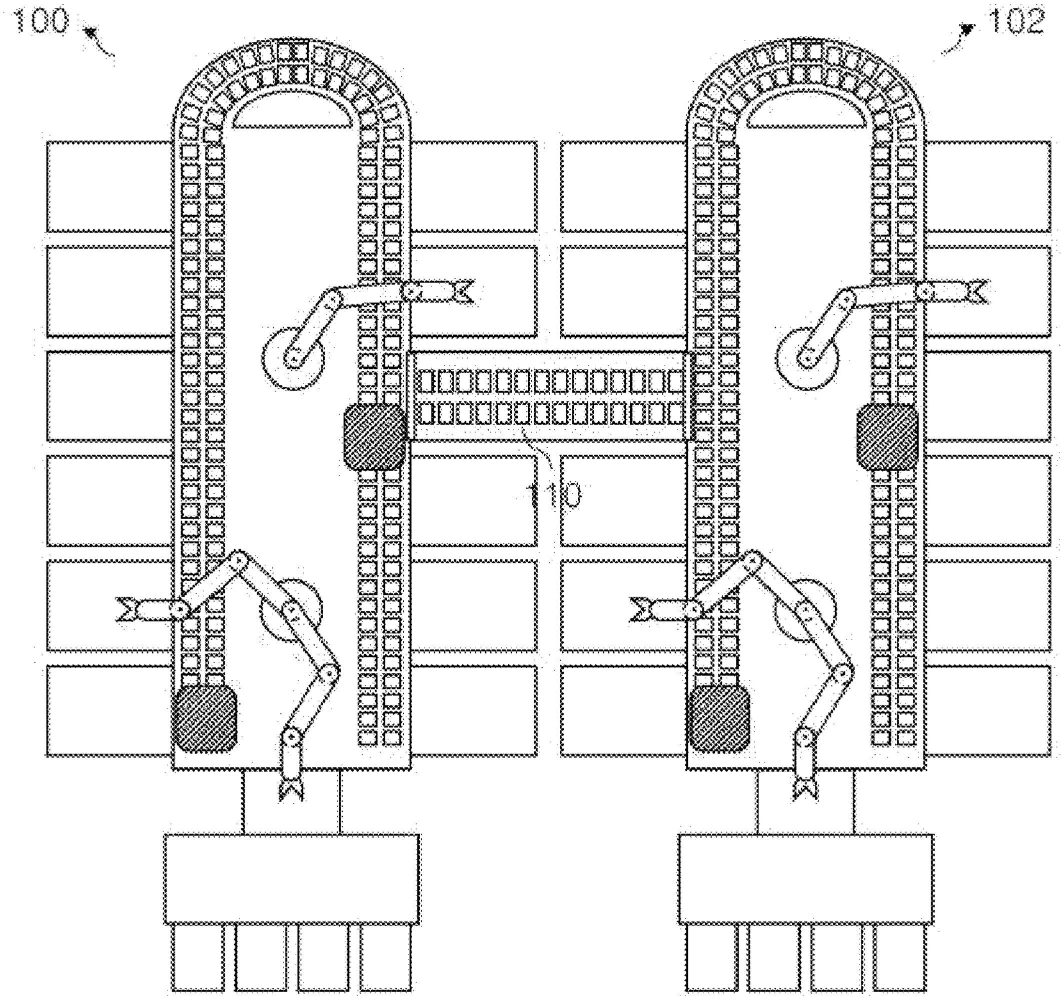
FIG. 2 is a view illustrating a substrate transfer process using a substrate transfer apparatus according to another embodiment.

FIG. 2 is a view illustrating a substrate transfer process using a substrate transfer apparatus according to another embodiment.

Referring to FIG. 2, the substrate transfer apparatus according to the another embodiment may include a first moving plate 100, another moving plate 102, and a link 110 that connects them. In addition, the substrate transfer apparatus, as in the substrate transfer apparatus of FIG. 1, may include a plurality of processing chambers, magnetic levitation rails, a plurality of arms, and a plurality of shuttles.

Through the substrate transfer apparatus of FIG. 2, a substrate processing amount may be enhanced. In detail, any one of the plurality of processing chambers that are connected to the moving plate 100 may break down. Then, the shuttle may be moved to the another moving plate 102 that is connected to the moving plate 100 through the link 110. The shuttle may deliver the substrate to a normal processing chamber that is connected to the another moving plate 102 to perform processing that is performed in the broken processing chamber, on the substrate.

In this way, the link 110 may function as a leg that connects the moving plates. The shuttle may be moved between the moving plates through the link 110, and thus a processing amount may be increased through the efficient substrate processing. FIG. 2 illustrates the link having a rectangular shape, but the shape of the link 110 is not limited thereto, and may have various shapes, such as a circular shape, an elliptical shape, a wave shape, an arch shape, a stepped shape, a diagonal shape, and a slide shape.

According to an embodiment, the link 110 may be implemented such that a length thereof is adjusted. Because the length between the moving plates is not fixed to a specific value, the length of the link 110 may be adjusted to a suitable length. For example, the link 110 may be implemented to have a slide shape, or a shape including a plurality of steps, but the present disclosure is not limited thereto.

To increase a processing amount of the substrates, the moving plates may be connected to each other to be adjacent to each other, and may be connected to each other in an upward/downward vertical disposition. In detail, because the second moving plate disposed on a lower side of the first moving plate is used, movement to a replaceable processing chamber or a processing chamber that performs an another process due to a breakdown of a processing chamber may be possible. Then, a structure for moving the shuttle between the moving plates that are disposed on upper and lower sides is necessary.

The present disclosure is a substrate transfer apparatus that allows movement between layers, and includes a layer transfer that may allow movement of the shuttle between layers. Hereinafter, the substrate transfer that allows movement between layers will be described in detail with reference to FIGS. 3 to 6.

Figure 3:
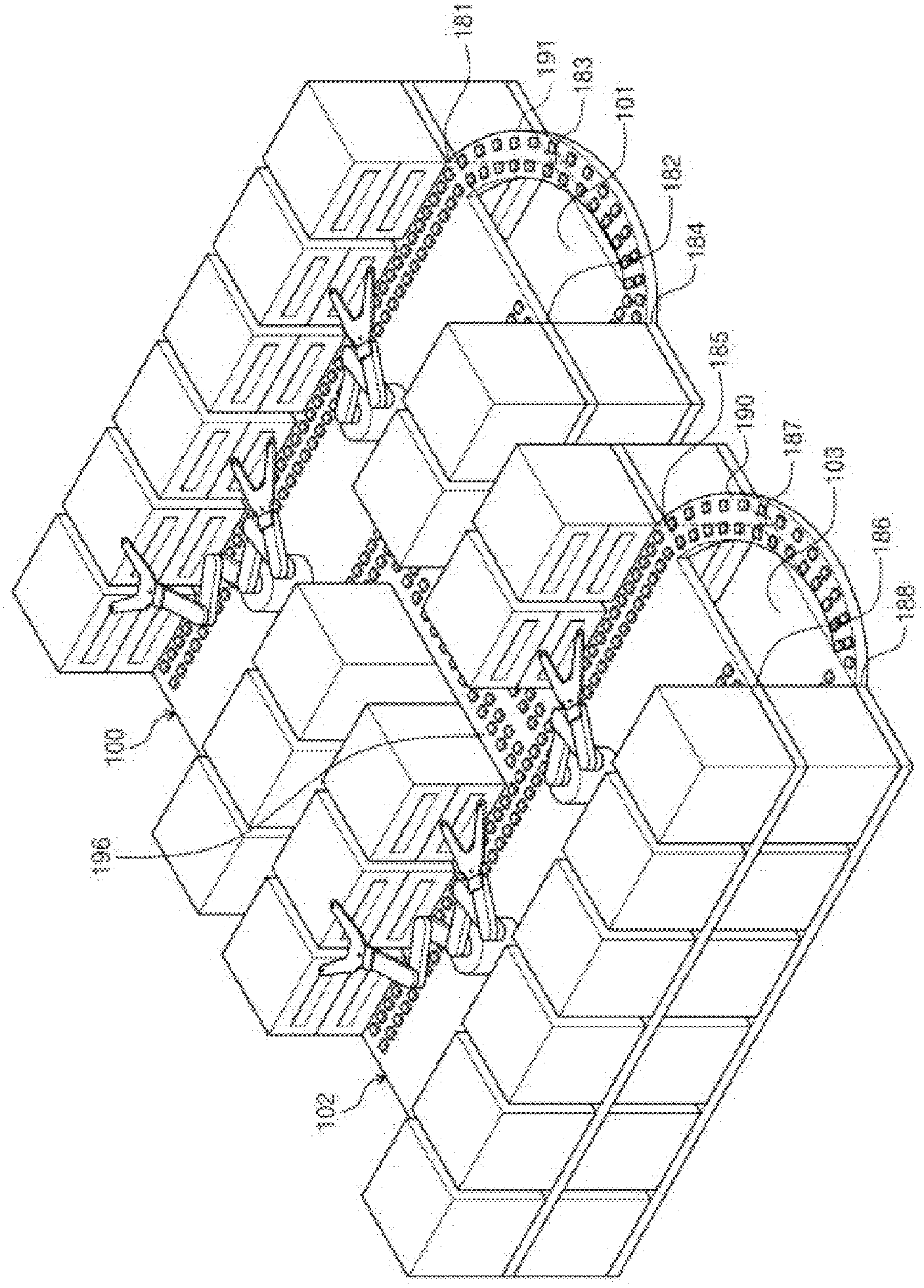
FIG. 3 is a view illustrating a substrate transfer apparatus that allows movement between layers according to an embodiment.

FIG. 3 is a view illustrating the substrate transfer apparatus that allows movement between layers according to an embodiment.

Referring to FIG. 3, the substrate transfer apparatus that allows movement between layers according to an embodiment may include the first moving plate 100, a second moving plate 101, a third moving plate 102, and a fourth moving plate 103. Furthermore, the substrate transfer apparatus may include a plurality of processing chambers that are disposed to be adjacent to the moving plates, a plurality of arms that are disposed on the moving plates, magnetic levitation rails, and a plurality of shuttles.

The second moving plate 101 may be located on a lower side of the first moving plate 100. Then, the second moving plate 101 may be disposed to correspond to the first moving plate 100. In detail, when viewed from a top, central axes or central points of the first moving plate 100 and the second moving plate 101 may overlap each other. However, the present disclosure is not limited thereto, and a location of the second moving plate 101 may be freely disposed while not corresponding to that of the first moving plate 100.

The first moving plate 100 and the third moving plate 102 may be disposed on the same layer. The first moving plate 100 and the third moving plate 102 may be connected to a first link 196. Accordingly, the shuttle located on the first moving plate 100 may be moved to the third moving plate 102 through the first link 196.

The third moving plate 102 may be disposed on the same straight line with the first moving plate 100. In detail, when viewed from a front side, central points or axes of the first moving plate 100 and the third moving plate 102 may overlap each other. However, the present disclosure is not limited thereto, and a location of the third moving plate 102 may be disposed not on the same straight line with the first moving plate 100 but freely.

The fourth moving plate 103 may be located on a lower side of the third moving plate 102. The fourth moving plate 103 may be disposed to correspond to the third moving plate 102. In detail, when viewed from a top, central axes or central points of the third moving plate 102 and the fourth moving plate 103 may overlap each other. However, the present disclosure is not limited thereto, and a location of the third moving plate 102 may be freely disposed while not corresponding to that of the fourth moving plate 103.

The second moving plate 101 and the fourth moving plate 103 may be disposed on the same layer. The second moving plate 101 and the fourth moving plate 103 may be connected to a second link (not illustrated). Accordingly, the shuttle located on the second moving plate 101 may be moved to the fourth moving plate 103 through the second link.

The first moving plate 100 and the second moving plate 101 may be connected to each other by a first layer transfer 191. The first layer transfer 191 may be connected to the first moving plate 100 and the second moving plate 101 and may be configured to move the shuttle from any one of the first moving plate 100 and the second moving plate 101 to the other one.

The first moving plate 100 may include a first side surface 181 and a second side surface 182. The first side surface 181 may be disposed to be adjacent to a first processing chamber group including a plurality of processing chambers. Furthermore, the second side surface 182 may be disposed to be adjacent to a second processing chamber group including a plurality of processing chambers. Then, the first processing chamber group and the second processing chamber group may be disposed to face each other.

Like the first moving plate 100, the second moving plate 101 may include a third side surface 183 corresponding to the first side surface 181 and a fourth side surface 184 corresponding to the second side surface 182. The third side surface 183 may be disposed to be adjacent to a third processing chamber group including a plurality of processing chambers. Furthermore, the fourth side surface 184 may be disposed to be adjacent to a fourth processing chamber group including a plurality of processing chambers. Then, the third processing chamber group and the fourth processing chamber group may be disposed to face each other. Furthermore, then, the third processing chamber group may be disposed on a lower side of the first processing chamber group, and the fourth processing chamber group may be disposed on a lower side of the second processing chamber group.

One end of the first layer transfer 191 may be connected to the first moving plate 100, and an opposite end thereof may be connected to the second moving plate 101. The first layer transfer 191, as in FIG. 3, may have a spiral shape including a curved surface. However, the present disclosure is not limited thereto, and the shape of the first layer transfer 191 may have various shapes, such as a stepped shape or a rectangular shape. Furthermore, the spiral shape of FIG. 3 corresponds to only a half of one rotation, but the present disclosure is not limited thereto, and the first layer transfer 191 may have a spiral shape of several rotations, such as one and a half rotation.

The first layer transfer 191 may include a protector (not illustrated) for preventing a collision or a fall of the shuttle. In detail, two or more shuttles may be moved on the first layer transfer 191. Then, to prevent two or more shuttles from colliding with each other, a movement direction on the first layer transfer 191 may be set.

For example, the shuttles that move from the upper layer to the lower layer along a left-hand/right-hand traffic, as in a road for vehicles and shuttles that move from the lower layer to the upper layer may follow a specific path. Then, a protector for preventing collision of a shuttle may be disposed between specific paths (e.g., a center of the first layer transfer 191), as in a guardrail of a center line of a road for vehicles. Then, the shape of the protector may have various shapes, such as a guardrail shape or a bar shape. Furthermore, a material of the protector may be various materials, such as a sponge material or a cushion material that may absorb an impact force.

Furthermore, the first layer transfer 191 may include a protector (not illustrated) that is disposed to prevent the shuttle from being fallen to an outside during movement thereof. For example, the protector may be disposed on an outskirt of a side surface of the first layer transfer 191, but the present disclosure is not limited thereto. Furthermore, the shape of the protector may have various shapes, such as a guardrail shape or a bar shape. Furthermore, the material of the protector may be various materials, such as a sponge material or a cushion material, which may absorb an impact force.

One end of the first layer transfer 191 may be connected to the first moving plate 100 to be closer to the first side surface 181 than to the second side surface 182 of the first moving plate 100. Furthermore, an opposite end of the first layer transfer 191 may be connected to the second moving plate 101 to be closer to the fourth side surface 184 than to the third side surface 183 of the second moving plate 101. Accordingly, when viewed from a top, one end and an opposite end of the first layer transfer 191 may be located to be closer to different side surfaces of the first moving plate 100 or the second moving plate 101.

A magnetic levitation rail may be disposed on one surface of the first layer transfer 191. The shuttle may be magnetically levitated by the magnetic levitation rail of the first layer transfer 191 to be moved to the second moving plate 101 or in an opposite direction on the first moving plate 100. For example, the first processing chamber that is disposed to be adjacent to the first moving plate 100 may break down. Then, the shuttle may use the first layer transfer 191 to move the substrate to the second processing chamber that is disposed to be adjacent to the second moving plate 101.

The shuttle may be moved from a layer (the upper layer) of the first moving plate 100 to a layer (the lower layer) of the second moving plate 101 through the first layer transfer 191. The shuttle may deliver the substrate to the second processing chamber that performs the same processing as that of the first processing chamber. In this way, the layers may be switched through the first layer transfer 191, and a processing amount of the substrates may be enhanced.

The third moving plate 102 and the fourth moving plate 103 also may be connected to each other by a layer transfer 190. The layer transfer 190 may be connected to the third moving plate 102 and the fourth moving plate 103 and may be configured to move the shuttle from any one of the third moving plate 102 and the fourth moving plate 103 to the other one.

Like the first moving plate 100, the third moving plate 102 may include a fifth side surface 185 and a sixth side surface 186. The fifth side surface 185 may be disposed to be adjacent to a fifth processing chamber group including a plurality of processing chambers. Furthermore, the sixth side surface 186 may be disposed to be adjacent to a sixth processing chamber group including a plurality of processing chambers. Then, the fifth processing chamber group and the sixth processing chamber group may be disposed to face each other.

Like the third moving plate 102, the fourth moving plate 103 may include a seventh side surface 187 corresponding to the fifth side surface 185, and an eighth side surface 188 corresponding to the sixth side surface 186. The seventh side surface 187 may be disposed to be adjacent to a seventh processing chamber group including a plurality of processing chambers. Furthermore, the eighth side surface 188 may be disposed to be adjacent to an eighth processing chamber group including a plurality of processing chambers. Then, the seventh processing chamber group and the eighth processing chamber group may be disposed to face each other. Furthermore, then, the seventh processing chamber group may be disposed on a lower side of the fifth processing chamber group, and the eighth processing chamber group may be disposed on a lower side of the sixth processing chamber group.

One end of the layer transfer 190 connected to the third moving plate 102 and the fourth moving plate 103 may be connected to the third moving plate 102, and an opposite end thereof may be connected to the fourth moving plate 103. The layer transfer 190 may have a spiral shape including a curved surface as in FIG. 3. However, the present disclosure is not limited thereto, and the shape of the layer transfer may be various shapes, such as a stepped shape or a rectangular shape.

One end of the layer transfer 190 may be connected to the third moving plate 102 to be closer to the fifth side surface 185 than to the sixth side surface 186 of the third moving plate 102. Furthermore, an opposite end of the layer transfer 190 may be connected to the fourth moving plate 103 to be closer to the eighth side surface 188 than to the seventh side surface 187 of the fourth moving plate 103. Accordingly, when viewed from a top, one end and an opposite end of the layer transfer 190 may be located to be closer to different side surfaces of the third moving plate 102 or the fourth moving plate 103.

Furthermore, the layer transfer 190 may be disposed to be symmetrical to the first layer transfer 191. In detail, FIG. 3 illustrates that one end of the layer transfer 190 is connected to be closer to the fifth side surface 185 corresponding to the first side surface 181, but unlike this, one end of the layer transfer 190 may be connected to be closer to the sixth side surface 186. Then, an opposite end of the layer transfer 190 may be connected not to the eighth side surface 188 but to the seventh side surface 187. In this case, the layer transfer 190 and the first layer transfer 191 may be disposed to be symmetrical to each other.

A magnetic levitation rail may be disposed on one surface of the layer transfer 190. The shuttle may be magnetically levitated by the magnetic levitation rail of the layer transfer 190 to be moved to the fourth moving plate 103 or in an opposite direction on the third moving plate 102. For example, the fifth processing chamber that is disposed to be adjacent to the third moving plate 102 may break down. Then, the shuttle may use the layer transfer 190 to move the substrate to the seventh processing chamber that is disposed to be adjacent to the fourth moving plate 103.

The shuttle may be moved from a layer (the upper layer) of the third moving plate 102 to a layer (the lower layer) of the fourth moving plate 103 through the layer transfer 190. The shuttle may deliver the substrate to the seventh processing chamber that performs the same processing as that of the fifth processing chamber. In this way, the layers may be switched through the layer transfer 190, and a processing amount of the substrates may be enhanced.

Furthermore, for example, the fifth processing chamber that is disposed to be adjacent to the third moving plate 102 and the first processing chamber that is disposed to be adjacent to the first moving plate 100 may break down. Then, the shuttle may be moved from the third moving plate 102 to the first moving plate 100 through the first link 196 to move the substrate to the seventh processing chamber that is disposed to be adjacent to the fourth moving plate 103. Furthermore, the shuttle may be moved from the first moving plate 100 to the second moving plate 101 by using the first layer transfer 191.

In this way, the shuttle may be freely moved horizontally between the moving plates by using the first link 196 and the second link. Furthermore, the shuttle may be freely moved vertically between layers between the moving plates by using the layer transfer 190 and the first layer transfer 191.

A conventional substrate transfer apparatus utilizes an additional apparatus, such as an elevator, for movement between layers. However, the substrate transfer apparatus that allows movement between layers according to the present disclosure has a simple structure by using the magnetic levitation rails disposed on the moving plates and the layer transfer connected to the moving plate. Accordingly, hardware may be easily designed and installed and costs may be reduced.

Figure 4:
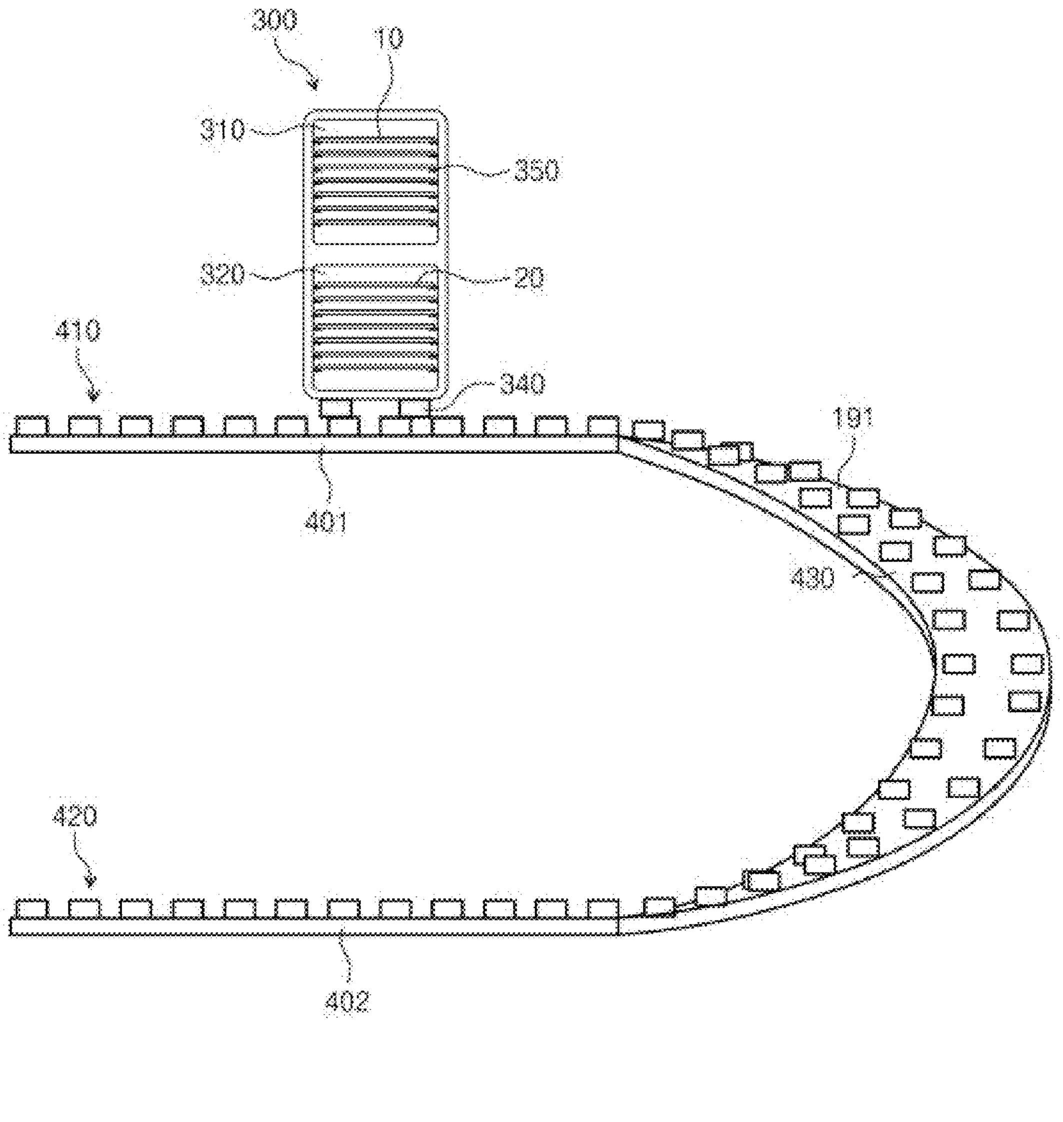
FIG. 4 is a side view illustrating a substrate transfer apparatus that allows movement between layers according to an embodiment.

FIG. 4 is a side view illustrating the substrate transfer apparatus that allows movement between layers according to an embodiment.

Referring to FIG. 4, the substrate transfer apparatus that allows movement between layers according to an embodiment may include an upper moving plate 401, a lower moving plate 402, and a layer transfer 430. Furthermore, the substrate transfer apparatus may include a first magnetic levitation rail 410 that is disposed on the upper moving plate 401, a second magnetic levitation rail 420 that is disposed on the lower moving plate 402, and a shuttle 300 that is configured to be moved on the magnetic levitation rail.

One surface of the layer transfer 430 may be connected to the upper moving plate 401, and an opposite surface thereof may be connected to the lower moving plate 402. The magnetic levitation rail may be disposed on one surface of the layer transfer 430, and thus, the shuttle 300 may be moved between the upper moving plate 401 and the lower moving plate 402 by the magnetic levitation rails.

FIG. 4 illustrates the layer transfer 430 of a spiral shape including a curved surface, but the shape of the layer transfer 430 is not limited thereto, and may have various shapes, such as a slide shape or a stepped shape.

The shuttle 300 may be configured to accommodate the substrate in an interior thereof. The shuttle 300 may include a permanent magnet 340 that is disposed to face the magnetic levitation rail. Although FIG. 4 illustrates that two permanent magnets are disposed on a lower side of the shuttle 300, and the number of permanent magnets is not limited thereto, and one, three, or four permanent magnets may be disposed. The permanent magnet 340 may magnetically levitate the shuttle 300 by using an attractive force or a repulsive force with an electromagnet. The shuttle 300 may be magnetically levitated on the first magnetic levitation rail 410 or the second magnetic levitation rail 420 by using the permanent magnet 340 to deliver the substrate to the processing chamber or move the substrate processed by the processing chamber.

The shuttle 300 may include a first space 310 and a second space 320 that are configured to accommodate one or more substrates. Then, the first space 310 and the second space 320 may be separated from each other. Environments of the first space 310 and the second space 320 may be set differently. For example, the first space 310 may be set to a vacuum state, and the second space 320 may be set to a non-vacuum state. Furthermore, for example, the environments of the first space 310 and the second space 320, such as temperatures and/or humidity, may be set differently.

The first space 310 and the second space 320 may be disposed along one axis. For example, as in FIG. 2, the first space 310 and the second space 320 may be disposed along an axis that is perpendicular to a ground surface. Then, the first space 310 may be disposed on an upper side of the second space 320. In this case, a transverse area of the moving plate, which is occupied by the shuttle 300, is small, and thus may be efficient in an aspect of movement.

Alternatively, the first space 310 and the second space 320 may be disposed along an axis that is parallel to the ground surface. In detail, unlike FIG. 2, the first space 310 and the second space 320 may be disposed side by side. In this case, an area longitudinally occupied by the moving plate may be small.

The kinds of the substrates accommodated in the first space 310 and the second space 320 may be different. In detail, the first space 310 may accommodate a substrate that is to be processed in the processing chamber, and the second space 320 may accommodate a substrate that has been processed in the processing chamber. Because the shuttle 300 divides and accommodates the substrates before and after processing by the processing chamber, the substrates before and after the processing may be prevented from being confused.

Furthermore, because the first space 310 and the second space 320 of the shuttle 300 are separated from each other, an environment that is optimized for the substrates before and after the processing may be provided. For example, because the first space 310 accommodates the substrate before the processing in a vacuum state and the second space 320 accommodates the substrate after the processing in a non-vacuum state, the shuttle 300 may provide an environment that is optimized for the respective substrates.

The shuttle 300 may include a support member 350 that may support the substrates accommodated in the interior thereof. In detail, the first space 310 and/or the second space 320 of the shuttle 300 may include the support member 350 that is configured to support the substrate. The substrate may be disposed on the support member 350 to be moved through the shuttle 300. The support member 350 may support a substrate before processing, a substrate after processing, a dummy substrate, or a sensor having a shape of a substrate. Then, the dummy substrate may be a test substrate for evaluating a stability and a performance of the entire apparatus.

According to an embodiment, a frictional member may be disposed on one surface of the support member 350. In detail, the frictional member may be disposed on, among several surfaces of the support member 350, one surface of the support member 350, which contacts a rear surface of the substrate. Then, the frictional member may include a material having a large frictional coefficient such that the supported substrate is prevented from being shaken due to fine shaking of the shuttle 300. For example, the frictional member may be neofrene or rubber, but the present disclosure is not limited thereto.

The shuttle 300 may include one or more sensors (not illustrated) in an interior thereof. In detail, a sensor that senses an interior environment may be disposed in the first space 310 and/or the second space 320 of the shuttle 300. The sensor may be a temperature sensor, a humidity sensor, a vibration sensor, a weight sensor, or an inclination sensor, but the present disclosure is not limited thereto.

For example, the first space 310 or the second space 320 may include a sensor that may measure a weight of the substrate or an inclination of the substrate. Furthermore, for example, the first space 310 or the second space 320 may include a sensor that may identify whether the temperature/humidity or a vacuum state of the space is properly set. Then, the sensor may have the same shape as that of the substrate, but the present disclosure is not limited thereto.

The sensor may sense overall environment information of the substrate transfer apparatus as well as an internal environment of the shuttle 300. In detail, the sensor may sense environment information in the processing chamber when the shuttle 300 enters the processing chamber. Furthermore, the sensor may sense environment information in the load lock chamber when the shuttle 300 enters the load lock chamber. In this way, the substrate transfer apparatus may sense the environment information in the apparatus by using the sensor of the shuttle 300.

Figure 5:
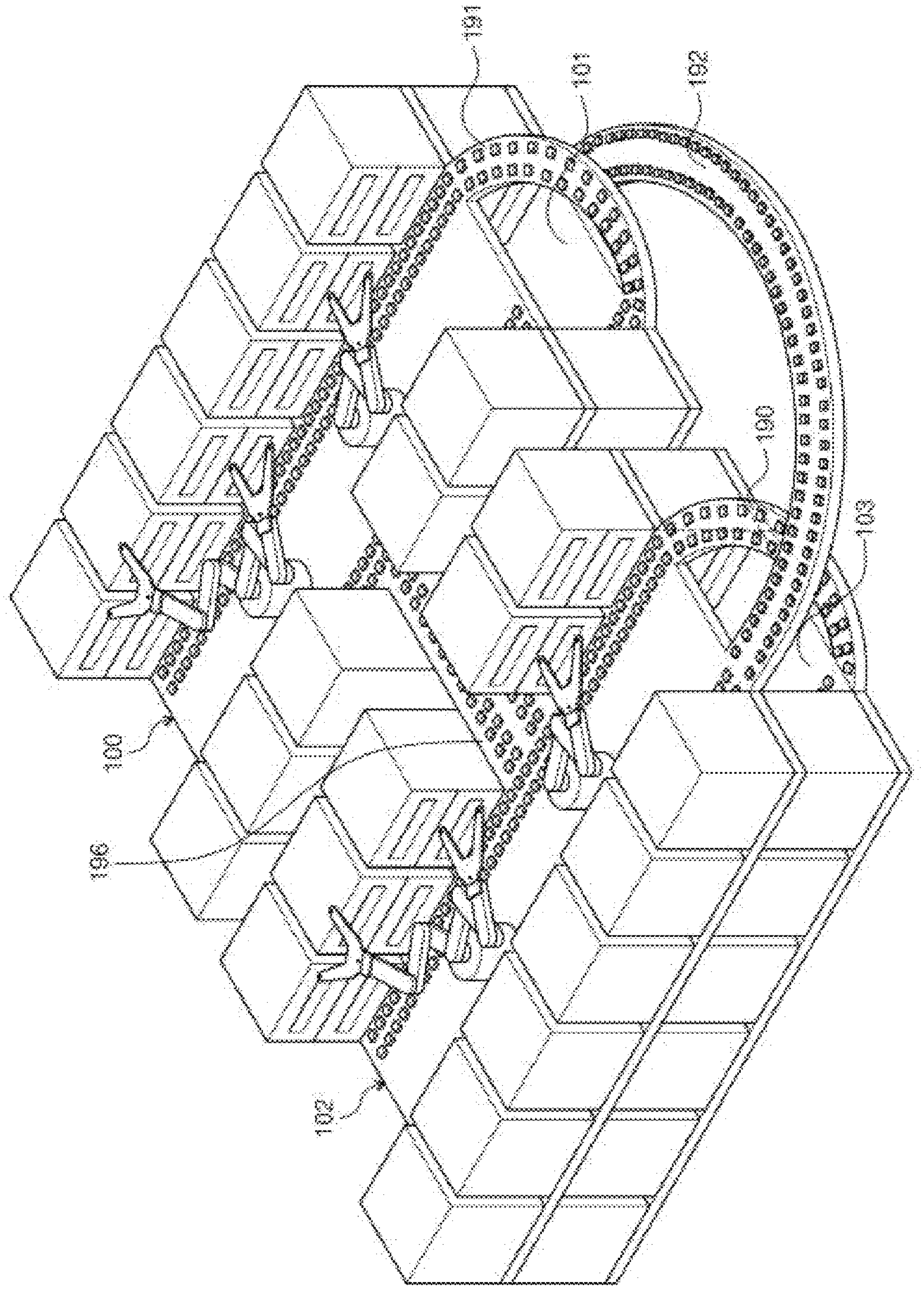
FIG. 5 is a view illustrating a substrate transfer apparatus that allows movement between layers according to another embodiment.

FIG. 5 is a view illustrating a substrate transfer apparatus that allows movement between layers according to another embodiment.

Referring to FIG. 5, the substrate transfer apparatus that allows movement between layers according to the another embodiment may include a moving plate and a transfer in a different form in addition to the substrate transfer apparatus of FIG. 3.

The substrate transfer apparatus may include a layer transfer that connects two moving plates that are located diagonally. In detail, the substrate transfer apparatus may include a second layer transfer 192 that is connected to the second moving plate 101 and the third moving plate 102 to move the shuttle from any one of the second moving plate 101 and the third moving plate 102 to the other one.

The second moving plate 101 may be connected to be closer to different side surfaces of the first layer transfer 191 and the second layer transfer 192. In detail, the first layer transfer 191 may be disposed to be closer to the fourth side surface 184 of the second moving plate 101, and the second layer transfer 192 may be disposed to be closer to the third side surface 183 of the second moving plate 101.

The third moving plate 102 may be connected to be closer to different side surfaces of the layer transfer 190 and the second layer transfer 192. In detail, the layer transfer 190 may be disposed to be closer to the fifth side surface 185 of the third moving plate 102, and the second layer transfer 192 may be disposed to be closer to the sixth side surface 186.

The second layer transfer 192 may be disposed not to meet the layer transfer 190 and the first layer transfer 191. When the substrate transfer apparatus is viewed from a front side, the second layer transfer 192 may have a point, at which the second layer transfer 192 crosses the layer transfer 190 and the first layer transfer 191 each other.

The substrate transfer apparatus of the present disclosure may provide movement between the moving plates disposed diagonally as well as movement between the moving plates disposed on the upper and lower sides of the shuttle, by employing the second layer transfer 192.

Figure 6:
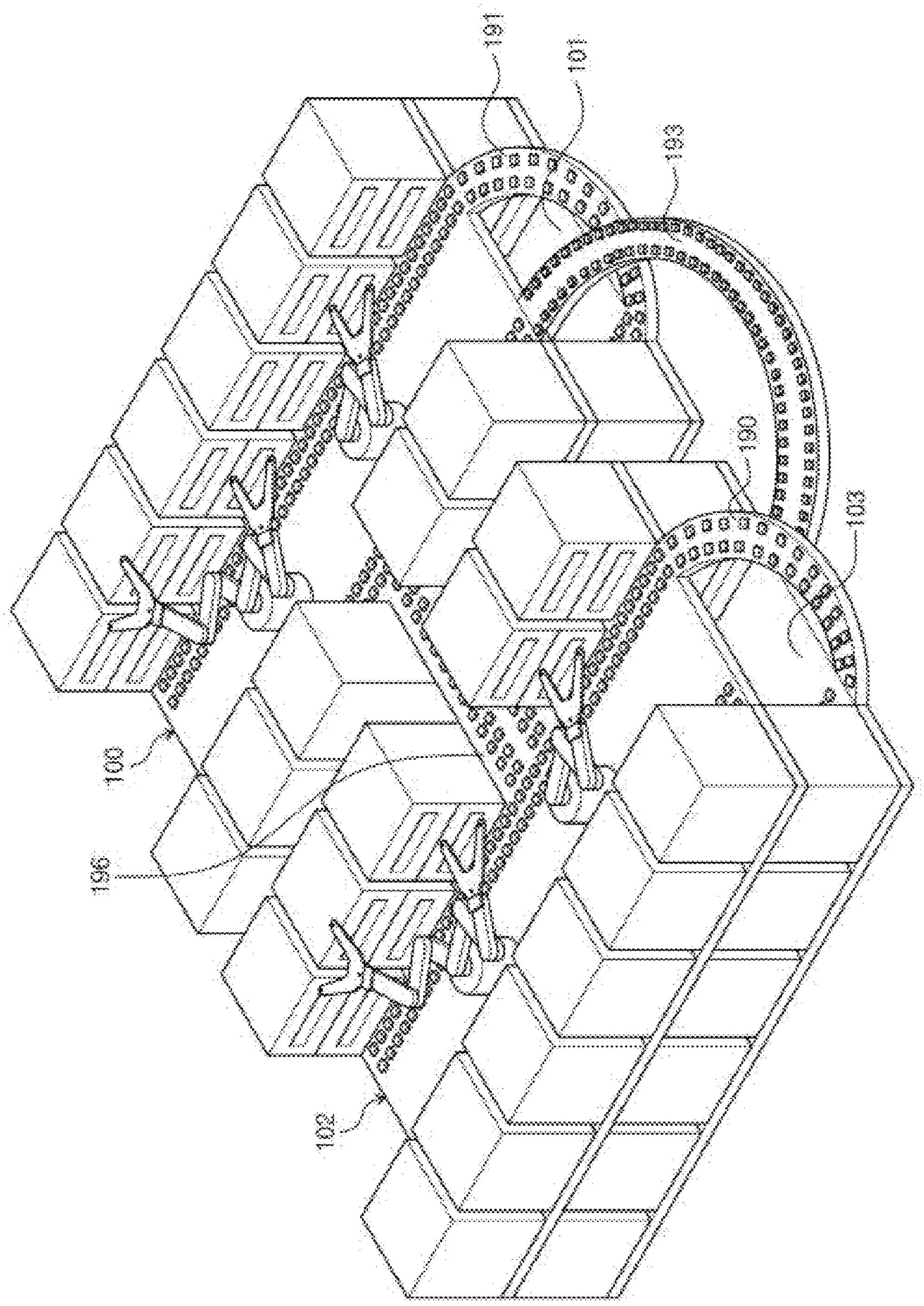
FIG. 6 is a view illustrating a substrate transfer apparatus that allows movement between layers according to another embodiment.

FIG. 6 is a view illustrating a substrate transfer apparatus that allows movement between layers according to another embodiment.

Referring to FIG. 6, the substrate transfer apparatus that allows movement between layers according to the another embodiment may include a moving plate and a transfer in a different form in addition to the substrate transfer apparatus of FIG. 3.

The substrate transfer apparatus may include a layer transfer that connects two moving plates that are located diagonally. In detail, the substrate transfer apparatus may include a third layer transfer 193 that is connected to the first moving plate 100 and the fourth moving plate 103 to move the shuttle from any one of the first moving plate 100 and the fourth moving plate 103 to the other one.

The first moving plate 100 may be connected to be closer to different side surfaces of the first layer transfer 191 and the third layer transfer 193. In detail, the first layer transfer 191 may be disposed to be closer to the first side surface 181 of the first moving plate 100, and the third layer transfer 193 may be disposed to be closer to the second side surface 182 of the first moving plate 100.

The fourth moving plate 103 may be connected to be closer to different side surfaces of the layer transfer 190 and the third layer transfer 193. In detail, the layer transfer 190 may be disposed to be closer to the eighth side surface 188 of the fourth moving plate 103, and the third layer transfer 193 may be disposed to be closer to the seventh side surface 187.

The third layer transfer 193 may be disposed not to meet the layer transfer 190 and the first layer transfer 191. When the substrate transfer apparatus is viewed from a front side, the second layer transfer 192 may have no point, at which the second layer transfer 192 crosses the layer transfer 190 and the first layer transfer 191 each other. However, when the layer transfer 190 is symmetrical to the first layer transfer 191, disposition and connection forms of the third layer transfer 193 may be changed according to occasions.

The substrate transfer apparatus of the present disclosure may provide movement between the moving plates disposed diagonally as well as movement between the moving plates disposed on the upper and lower sides of the shuttle, by employing the third layer transfer 193.

According to an embodiment of the present disclosure, the substrate transfer apparatus that allows movement of a substrate between layers may be provided whereby a processing amount in a limited area may be enhanced.

The methods according to the embodiments may be implemented in a form of program instructions that may be performed through various computer means and may be recorded in a computer readable medium. The computer readable medium may include program instructions, data files, or data structures alone or in combination. The program instructions recorded in the medium may be particularly designed and configured for the embodiments, or may be known to an ordinary person in a computer software field to be used. Examples of computer readable recording mediums include hardware devices, such as magnetic media, such as hard disks, floppy disks, and magnetic tapes, optical media, such as CD-ROMs and DVDs, magneto-optical media, such as floptical disks, ROMs, RAMs, and flash memories, which are particularly configured to store and perform program instructions. Examples of program instructions include high-level language codes that may be executed by computers by using interpreters, as well as machine language codes that are made by compilers. The hardware devices may be configured to be operated as one or more software modules to perform operations of the embodiments, and reverse cases may be possible.

In this way, although the embodiments have been described with reference to the limited embodiments and the drawings, an ordinary person in the art, to which the present disclosure pertains, may make various corrections and modifications from the description. For example, the described technology may achieve suitable results even though they are performed in sequences that are different from those of the described method and/or the components, such as the described systems, structures, devices, or circuits, are coupled or combined in a form that is different from that of the described method or replaced by other components or equivalents.

Therefore, other implementations, other embodiments, and equivalents to the claims pertain to the scope of the claims, which will be described above.

What is claimed is:

1. A substrate transfer apparatus comprising:
- a first moving plate;
- a second moving plate located on a lower side of the first moving plate;
- a shuttle configured to be moved on the first moving plate or the second moving plate and configured to accommodate a substrate; and
- a first magnetic levitation rail connected to the first moving plate and the second moving plate, and configured to move the shuttle from any one of the first moving plate and the second moving plate to the other one,
- wherein one end of the first magnetic levitation rail is connected to the first moving plate, and an opposite end thereof is connected to the second moving plate,
- wherein the first moving plate includes a first side surface and a second side surface,
- wherein the second moving plate includes a third side surface corresponding to the first side surface and a fourth side surface corresponding to the second side surface,
- wherein the one end of the first magnetic levitation rail is connected to the first moving plate to be closer to the first side surface rather than to the second side surface, and
- wherein the opposite end of the first magnetic levitation rail is connected to the second moving plate to be closer to the fourth side surface rather than to the third side surface.

2. The substrate transfer apparatus of claim 1, further comprising:
- a third moving plate disposed to be adjacent to the first moving plate; and
- a first link connected to the first moving plate and the third moving plate, and configured to move the shuttle from any one of the first moving plate and the third moving plate to the other one.

3. The substrate transfer apparatus of claim 2, further comprising:
- a second magnetic levitation rail connected to the second moving plate and the third moving plate, and configured to move the shuttle from any one of the second moving plate and the third moving plate to the other one.

4. The substrate transfer apparatus of claim 3, wherein the second moving plate includes a third side surface and a fourth side surface,
- wherein the first magnetic levitation rail is connected to the second moving plate to be closer to the fourth side surface than to the third side surface, and
- wherein the second magnetic levitation rail is connected to the second moving plate to be closer to the third side surface than to the fourth side surface.

5. The substrate transfer apparatus of claim 1, further comprising:
- a fourth moving plate disposed to be adjacent to the second moving plate; and
- a second link connected to the second moving plate and the fourth moving plate, and configured to move the shuttle from any one of the second moving plate and the fourth moving plate to the other one.

6. The substrate transfer apparatus of claim 5, further comprising:
- a third magnetic levitation rail connected to the first moving plate and the fourth moving plate, and configured to move the shuttle from any one of the first moving plate and the fourth moving plate to the other one.

7. The substrate transfer apparatus of claim 6, wherein the first moving plate includes a first side surface and a second side surface,
- wherein the first magnetic levitation rail is connected to the first moving plate to be closer to the first side surface than to the second side surface, and
- wherein the third magnetic levitation rail is connected to the first moving plate to be closer to the second side surface than to the first side surface.

8. The substrate transfer apparatus of claim 1, wherein the first magnetic levitation rail has a spiral shape including a curved surface.

9. The substrate transfer apparatus of claim 1, wherein each of the first moving plate and the second moving plate includes a magnetic levitation rail, and
- wherein the shuttle is magnetically levitated by the magnetic levitation rails to be moved on the first moving plate or the second moving plate.

10. The substrate transfer apparatus of claim 1, wherein the first magnetic levitation rail includes a protector configured to prevent a collision or a fall of the shuttle.

11. A substrate transfer apparatus comprising:
- a first moving plate;
- a second moving plate located on a lower side of the first moving plate;
- a shuttle configured to be moved on the first moving plate or the second moving plate and configured to accommodate a substrate;
- a first magnetic levitation rail connected to the first moving plate and the second moving plate, and configured to move the shuttle from any one of the first moving plate and the second moving plate to the other one;

a third moving plate disposed to be adjacent to the first moving plate; and a first link connected to the first moving plate and the third moving plate, and configured to move the shuttle from any one of the first moving plate and the third moving plate to the other one.

12. The substrate transfer apparatus of claim 11, further comprising:

a second magnetic levitation rail connected to the second moving plate and the third moving plate, and configured to move the shuttle from any one of the second moving plate and the third moving plate to the other one.

13. The substrate transfer apparatus of claim 12, wherein the second moving plate includes a third side surface and a fourth side surface, wherein the first magnetic levitation rail is connected to the second moving plate to be closer to the fourth side surface than to the third side surface, and wherein the second magnetic levitation rail is connected to the second moving plate to be closer to the third side surface than to the fourth side surface.

14. A substrate transfer apparatus comprising:

a first moving plate;

a second moving plate located on a lower side of the first moving plate;

a shuttle configured to be moved on the first moving plate or the second moving plate and configured to accommodate a substrate;

a first magnetic levitation rail connected to the first moving plate and the second moving plate, and configured to move the shuttle from any one of the first moving plate and the second moving plate to the other one;

a fourth moving plate disposed to be adjacent to the second moving plate; and a second link connected to the second moving plate and the fourth moving plate, and configured to move the shuttle from any one of the second moving plate and the fourth moving plate to the other one.

15. The substrate transfer apparatus of claim 14, further comprising:

a third magnetic levitation rail connected to the first moving plate and the fourth moving plate, and configured to move the shuttle from any one of the first moving plate and the fourth moving plate to the other one.

16. The substrate transfer apparatus of claim 15, wherein the first moving plate includes a first side surface and a second side surface, wherein the first magnetic levitation rail is connected to the first moving plate to be closer to the first side surface than to the second side surface, and wherein the third magnetic levitation rail is connected to the first moving plate to be closer to the second side surface than to the first side surface.

* * * * *